(12) United States Patent
Yan

(10) Patent No.: US 9,646,997 B2
(45) Date of Patent: May 9, 2017

(54) ARRAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventor: Liangchen Yan, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 233 days.

(21) Appl. No.: 14/381,646

(22) PCT Filed: Dec. 17, 2013

(86) PCT No.: PCT/CN2013/089674
§ 371 (c)(1),
(2) Date: Aug. 28, 2014

(87) PCT Pub. No.: WO2015/010427
PCT Pub. Date: Jan. 29, 2015

(65) Prior Publication Data
US 2016/0233250 A1 Aug. 11, 2016

(30) Foreign Application Priority Data
Jul. 26, 2013 (CN) .......................... 2013 1 0319802

(51) Int. Cl.
*H01L 29/78* (2006.01)
*H01L 27/12* (2006.01)
(Continued)

(52) U.S. Cl.
CPC ........ *H01L 27/1225* (2013.01); *H01L 27/127* (2013.01); *H01L 27/1288* (2013.01);
(Continued)

(58) Field of Classification Search
CPC ..... H01L 29/24; H01L 29/7869; H01L 21/00; H01L 21/16; H01L 21/479; H01L 27/12;
(Continued)

(56) References Cited

U.S. PATENT DOCUMENTS

2010/0051935 A1 3/2010 Lee
2011/0240991 A1* 10/2011 Yamazaki ........... H01L 29/7831
257/43
(Continued)

FOREIGN PATENT DOCUMENTS

CN 101527318 9/2009
CN 202957251 5/2013
(Continued)

OTHER PUBLICATIONS

Office Action in corresponding Chinese Patent Application No. 201310319802.4, dated Jul. 31, 2015.
(Continued)

*Primary Examiner* — Monica D Harrison
(74) *Attorney, Agent, or Firm* — Brooks Kushman P.C.

(57) ABSTRACT

The present invention provides an array substrate. The active layer of the array substrate comprises at least two metal oxide semiconductor layers, wherein the at least two metal oxide semiconductor layers includes a first metal oxide semiconductor layer and a second metal oxide semiconductor layer, the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer.

20 Claims, 3 Drawing Sheets

(51) Int. Cl.
*H01L 29/66* (2006.01)
*H01L 29/786* (2006.01)

(52) U.S. Cl.
CPC .... *H01L 29/66969* (2013.01); *H01L 29/7869* (2013.01); *H01L 29/78696* (2013.01)

(58) Field of Classification Search
CPC . H01L 27/122; H01L 27/127; H01L 27/1225; H01L 27/1228; H01L 29/66; H01L 29/669; H01L 29/66969; H01L 29/78; H01L 29/786; H01L 29/78696
USPC .......................................................... 257/43
See application file for complete search history.

(56) References Cited

U.S. PATENT DOCUMENTS

2013/0256653 A1* 10/2013 Ahn .................. H01L 29/78696
257/43

2014/0175435 A1* 6/2014 Yamazaki ......... H01L 29/78618
257/43

FOREIGN PATENT DOCUMENTS

| CN | 103412450 | 11/2013 |
| CN | 203351574 | 12/2013 |
| WO | 2012091297 | 7/2012 |

OTHER PUBLICATIONS

Office Action issued in corresponding Chinese Application No. 2013103198024 dated May 29, 2015.

International Search Report and Written Opinion issued in corresponding International Application No. PCT/CN2013/089674 dated May 5, 2014.

* cited by examiner

ARRAY SUBSTRATE, METHOD FOR MANUFACTURING THE SAME AND DISPLAY DEVICE

CROSS-REFERENCE TO RELATED APPLICATION

This application is the U.S. national phase of PCT Application No. PCT/CN 2013/089674 filed on Dec. 17, 2013, which claims priority to Chinese Patent Application No. 201310319802.4 filed on Jul. 26, 2013, the disclosures of which are incorporated in their entirety by reference herein.

TECHNICAL FIELD

The present invention relates to a field of display technique, and in particular relates to an array substrate, a method for manufacturing the array substrate, and a display device.

BACKGROUND

Along with continuous improvement of technology, a user's requirement for a liquid crystal display device is increasing and a thin film transistor-liquid crystal display (TFT-LCD) has also become a popular display used in a product such as a mobile phone, a tablet computer, etc. Moreover, along with the popularity of the display device, a user's requirement for a large-size display device is increasingly common.

The performance of the TFT determines the display quality of LCD. Amorphous silicon is often used for an active layer in mass production, but amorphous silicon has many defects and the mobility of amorphous silicon is low. The actual mobility of carrier of the amorphous silicon TFT is about 10 $cm^2/(V*s)$. Due to too many defects, most of electric charges attracted by the gate electrode is grabbed by the defects and is unable to provide electrical conductivity. This will cause that the mobility of equivalent carriers merely remains 1 $cm^2/(V*s)$, which cannot meet the demand for large-size display devices.

To improve the mobility of the active layer, the metal oxide semiconductor is used to prepare the active layer in the prior art. Some metal oxide semiconductor has not the higher mobility. Some metal oxide semiconductor has the relatively higher mobility, but has the relatively larger leakage current. It will affect the performance of TFT and result in abnormal display of the display devices.

SUMMARY

The technical problem to be solved by the present invention is to provide an array substrate, a method for manufacturing the array substrate and a display device, wherein an active layer of the array substrate has a good and stable performance and has high mobility.

In order to solve the above technique problem, a technical scheme provided by an embodiment of the present invention is described below.

In one aspect, an array substrate is provided, wherein an active layer of the array substrate comprises at least two metal oxide semiconductor layers, and wherein the at least two metal oxide semiconductor layers includes a first metal oxide semiconductor layer and a second metal oxide semiconductor layer, the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer.

Further, in the above technical scheme, the first metal oxide semiconductor layer has the mobility of greater than 30 $cm^2/V*s$, and the second metal oxide semiconductor layer has the mobility of greater than 8-10 $cm^2/V*s$.

Further, in the above technical scheme, the first metal oxide semiconductor layer has a thickness of 10 nm-50 nm, and the second metal oxide semiconductor layer has a thickness of 10 nm-50 nm.

Further, in the above technical scheme, the first metal oxide semiconductor layer is ITZO, and the second metal oxide semiconductor layer is IGZO.

Further, in the above technical scheme, the array substrate specifically comprises:

a substrate, a gate electrode and a gate line on the substrate, the gate insulating layer on the gate electrode and the gate line, the active layer on the gate insulating layer, the etching barrier layer on the active layer, a drain electrode, a source electrode and a data line, formed from a source-drain metal layer on the etching barrier layer, a passivation layer on the drain electrode, the source electrode and the data line, the passivation layer comprising a via hole corresponding to the drain electrode, a pixel electrode on the passivation layer, the pixel electrode electrically connecting with the drain electrode through the via hole.

The embodiment of the present invention also provides a display device, comprising the above array substrate.

The embodiment of the present invention also provides a method for manufacturing an array substrate comprising:

forming an active layer of the array substrate comprising at least two metal oxide semiconductor layers, wherein the at least two metal oxide semiconductor layers includes a first metal oxide semiconductor layer and a second metal oxide semiconductor layer, the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer.

Further, in the above technical scheme, the method specifically comprises:

forming a pattern of a gate electrode and a gate line on a substrate, and forming the gate insulating layer, forming a pattern of the active layer on a substrate with the gate insulating layer, forming a pattern of the etching barrier layer on a substrate with the active layer, forming a pattern of a drain electrode, a source electrode and a data line on a substrate with the etching barrier layer, forming a pattern of a passivation layer on a substrate with the drain electrode, the source electrode and the data line, the pattern of the passivation layer comprising a via hole corresponding to the drain electrode, forming a pattern of a pixel electrode on a substrate with the passivation layer, the pixel electrode electrically connecting with the drain electrode through the via hole.

Further, in the above technical scheme, a step of forming the pattern of the active layer on the substrate with the gate insulating layer comprises:

depositing a first metal oxide semiconductor layer on the substrate with the gate insulating layer, depositing a second metal oxide semiconductor layer on the first metal oxide semiconductor layer, coating a photoresist to the second metal oxide semiconductor layer and forming the pattern of the active layer comprising the first metal oxide semiconductor layer and the second metal oxide semiconductor layer by a patterning process.

Further, in the above technical scheme, the first metal oxide semiconductor layer is ITZO, and the second metal oxide semiconductor layer is ITZO.

The embodiment of the present invention has the following advantages:

in the above technical scheme, the active layer of the array substrate comprises at least two metal oxide semiconductor layers, wherein the at least two metal oxide semiconductor layers includes the first metal oxide semiconductor layer and the second metal oxide semiconductor layer, the first metal oxide semiconductor layer is formed on the gate insulating layer, an etching barrier layer is formed on the second metal oxide semiconductor layer, and the mobility of the first metal oxide semiconductor layer is greater than the mobility of the second metal oxide semiconductor layer. This may reduce the leakage current and stabilize the performance of TFT. In this way, the active layer which has a good and stable performance and has high mobility can be manufactured by the combination of at least two metal oxide semiconductor layers.

LIST OF REFERENCE

Figure 1:
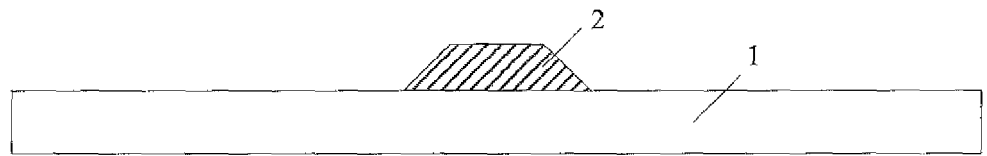
FIG. 1 is a sectional view showing a substrate having the gate electrode and the gate line according to an embodiment of the present invention.

1, a base substrate 2, a gate electrode 3, a gate insulating layer
4, a first metal oxide semiconductor layer
5, a second metal oxide semiconductor layer
6, an etching barrier layer 7, a source-drain metal layer
8, a passivation layer 9, a pixel electrode

DETAILED DESCRIPTION

In order to make the technical problem to be solved by embodiments of the present invention and the technical scheme and the advantage of the present invention clearer, a detailed description will be shown below in combination with the appended drawings and the following embodiments.

The embodiment of the present invention provides an array substrate, a method for manufacturing the array substrate and a display device, wherein the array substrate has an active layer with a good and stable performance and high mobility.

The embodiment of the present invention provides an array substrate, wherein an active layer of the array substrate comprises at least two metal oxide semiconductor layers, and wherein the at least two metal oxide semiconductor layers includes a first metal oxide semiconductor layer and a second metal oxide semiconductor layer, the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer.

In the array substrate according to the present invention, the first metal oxide semiconductor layer as a carrier-transporting layer has the higher mobility, and the second metal oxide semiconductor layer as a higher resistance layer has the lower mobility. This may reduce the leakage current and stabilize the performance of TFT. In this way, the active layer which has a good and stable performance and has high mobility can be manufactured by the combination of at least two metal oxide semiconductor layers.

The array substrate according to the present invention is not limited to using the active layer formed from two metal oxide semiconductor layers. The active layer may have more than three layers on condition that the metal oxide semiconductor layer on the gate insulating layer has the higher mobility, and the metal oxide semiconductor layer on which the etching barrier layer is formed has the lower mobility. In the actual production process, in order to simplify production process and to save production costs, the active layer is generally formed from two metal oxide semiconductor layers.

Further, in order to guarantee that the prepared active layer has the higher mobility, the first metal oxide semiconductor layer generally has the mobility of greater than 30 $cm^2/V*s$. In order to guarantee that the prepared active layer has a good and stable performance, the second metal oxide semiconductor layer has the mobility of greater than 8-10 $cm^2/V*s$.

Further, the first metal oxide semiconductor layer has the thickness of 10 nm-50 nm, and the second metal oxide semiconductor layer has the thickness of 10 nm-50 nm.

In the array substrate according to the present invention, the first metal oxide semiconductor layer is ITZO and the second metal oxide semiconductor layer is IGZO. The mobility of IGZO is about 10 $cm^2/V*s$. The mobility of ITZO can reach more than 30 $cm^2/V*s$, but the leakage current of ITZO is greater. ITZO as the first metal oxide semiconductor layer is provided on the gate insulating layer. ITZO may use as a carrier-transporting layer because it has the higher mobility. IGZO as the second metal oxide semiconductor layer is provided under the source-drain metal layer and the etching barrier layer. IGZO may use as a higher resistance layer to reduce the leakage current and stabilize the performance of TFT.

Specifically, the array substrate of the present invention comprises:

a substrate, a gate electrode and a gate line on the substrate, the gate insulating layer on the gate electrode and the gate line, the active layer on the gate insulating layer, the etching barrier layer on the active layer, a drain electrode, a source electrode and a data line, formed from a source-drain metal layer on the etching barrier layer, a passivation layer on the drain electrode, the source electrode and the data line, the passivation layer comprising a via hole corresponding to the drain electrode, a pixel electrode on the passivation layer, the pixel electrode electrically connected with the drain electrode through the via hole.

The embodiment of the present invention also provides a display device, comprising the array substrate described in any one of the above embodiments. Wherein a structure of the array substrate is the same as that in the above embodiments, and will not be described here. Additionally, the structure of other parts of the display device may be known by referring to the prior art, and the details will not be described here. The display device may be: a product or a component having any display function, such as a liquid crystal panel, an electrical paper, a liquid crystal television, a liquid crystal display, a digital photo frame, a mobile phone, a tablet computer, etc.

The embodiment of the present invention also provides a method for manufacturing the array substrate, comprising:

forming an active layer of the array substrate comprising at least two metal oxide semiconductor layers, wherein the at least two metal oxide semiconductor layers includes a first metal oxide semiconductor layer and a second metal oxide semiconductor layer, the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer.

In the method for manufacturing the array substrate according to the present invention, the first metal oxide semiconductor layer as a carrier-transporting layer has the higher mobility, and the second metal oxide semiconductor layer as a higher resistance layer has the lower mobility. This may reduce the leakage current and stabilize the performance of TFT. In this way, the active layer which has a good and stable performance and has high mobility can be manufactured by the combination of at least two metal oxide semiconductor layers.

The method for manufacturing the array substrate according to the present invention is not limited to using the active layer formed from two metal oxide semiconductor layers. The active layer may have more than three layers on condition that the metal oxide semiconductor layer on the gate insulating layer has the higher mobility, and the metal oxide semiconductor layer on which the etching barrier layer is formed has the lower mobility. In the actual production process, in order to simplify production process and to save production costs, the active layer is generally formed from two metal oxide semiconductor layers.

Further, in order to guarantee that the prepared active layer has the higher mobility, the first metal oxide semiconductor layer generally has the mobility of greater than 30 $cm^2/V*s$. In order to guarantee that the prepared active layer has a good and stable performance, the second metal oxide semiconductor layer has the mobility of greater than 8-10 $cm^2/V*s$.

Specifically, the method comprises:

forming a pattern of a gate electrode and a gate line on a substrate, and forming the gate insulating layer, forming a pattern of the active layer on the substrate with the gate insulating layer, forming a pattern of the etching barrier layer on the substrate with the active layer, forming a pattern of a drain electrode, a source electrode and a data line on the substrate with the etching barrier layer, forming a pattern of a passivation layer on the substrate with the drain electrode, the source electrode and the data line, the pattern of the passivation layer comprising a via hole corresponding to the drain electrode, forming a pattern of a pixel electrode on the substrate with the passivation layer, the pixel electrode electrically connecting with the drain electrode through the via hole.

Wherein, a step of forming the pattern of the active layer on the substrate with the gate insulating layer comprises:

depositing a first metal oxide semiconductor layer on the substrate with the gate insulating layer, depositing a second metal oxide semiconductor layer on the first metal oxide semiconductor layer, coating a photoresist to the second metal oxide semiconductor layer and forming the pattern of the active layer comprising the first metal oxide semiconductor layer and the second metal oxide semiconductor layer.

In the method according to the present invention, the first metal oxide semiconductor layer is ITZO and the second metal oxide semiconductor layer is IGZO. IGZO has the mobility of about 10 $cm^2/V*s$. ITZO can has the mobility of more than 30 $cm^2/V*s$, but ITZO has the greater leakage current. ITZO as the first metal oxide semiconductor layer is provided on the gate insulating layer. ITZO may use as a carrier-transporting layer because it has a higher mobility. IGZO as the second metal oxide semiconductor layer is provided under the source-drain metal layer and the etching barrier layer. IGZO may use as a higher resistance layer to reduce the leakage current and stabilize the performance of TFT.

The method for manufacturing the array substrate in this embodiment is further described below in combination with a specific process.

As shown in FIG. 1-8, the method for manufacturing the array substrate according to the present invention comprises the following steps.

Step a, providing the substrate and forming the pattern of the gate electrode and the gate line consisted of a gate metal layer;

As shown in FIG. 1, at first, the pattern of the gate electrode 2 and the gate line connecting with the gate electrode 2 formed from the gate metal layer is formed on the substrate 1 through a single patterning process. Wherein, the substrate 1 may be a glass substrate or a quartz substrate.

Specifically, the gate metal layer may be deposited on the substrate 1 by a method such as sputtering or thermal evaporation. The gate metal layer may be selected from Cr, W, Ti, Ta, Mo, Al, Cu or its alloys. The gate metal layer may consist of multilayer metal films. A photoresist is coated to the gate metal layer and the photoresist is exposed with the presence of a mask. A photoresist reserved area and a photoresist unreserved area are formed. Wherein the photoresist reserved area corresponds to an area in which the pattern of the gate electrode 2 and the gate line is located and the photoresist unreserved area corresponds to an area other than the area in which the pattern of the gate electrode and the gate line is located. After a developing process, the photoresist unreserved area is completely removed, while a thickness of the photoresist reserved area remains unchanged. The gate metal layer in the photoresist unreserved area is completely etched through an etching process to form the pattern of the gate electrode 2 and the gate line. The remaining photoresist is peeled off.

Figure 2:
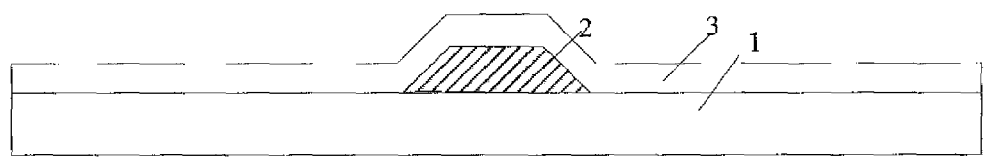
FIG. 2 is a sectional view showing a substrate having the gate insulating layer according to an embodiment of the present invention.

Step b: as shown in FIG. 2, forming the gate insulating layer 3 on the substrate having the gate electrode 2 and the gate line.

Specifically, a plasma enhanced chemical vapor deposition (PECVD) method may be adopted. A material for the gate insulating layer is deposited on the substrate undergoing the Step b in the thickness of 1000 Å~4000 Å to form the gate insulating layer 3. Wherein the material for the gate insulating layer may be selected from an oxide, a nitride, or a nitrogen oxide, and the gate insulating layer may have a one-layer, two-layer or multiple-layer structure.

Step c: depositing the first metal oxide semiconductor layer 4 and the second metal oxide semiconductor layer 5 on the substrate with the gate insulating layer.

Figure 3:
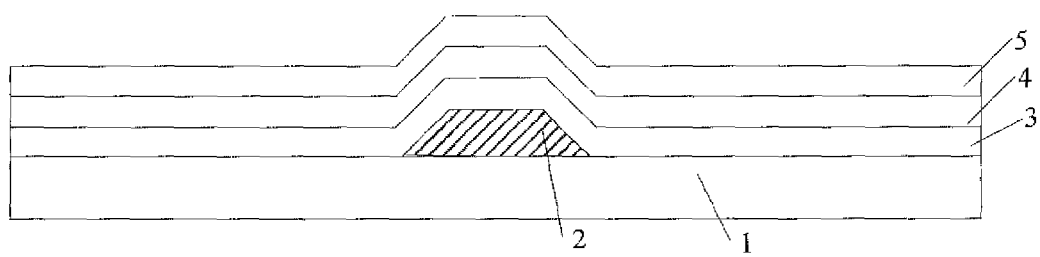
FIG. 3 is a sectional view showing a array substrate having the first metal oxide semiconductor layer and the second metal oxide semiconductor layer according to an embodiment of the present invention.

Specifically, as shown in FIG. 3, ITZO can be deposited as the first oxide semiconductor layer 4 on the substrate subjected to step b by the magnetron sputtering, thermal evaporation or other film-forming methods. Specifically, the thickness of the ITZO may be 10 nm-50 nm. IGZO can then be deposited as the second metal oxide semiconductor layer 5. The thickness of IGZO may be 10 nm-50 nm.

Figure 4:
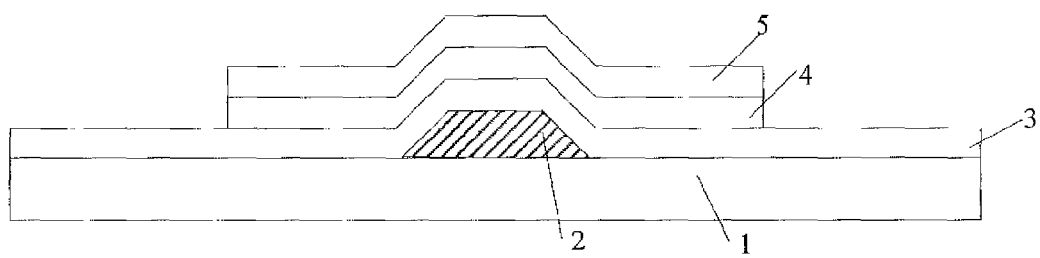
FIG. 4 is a sectional view showing a array substrate having the pattern of the active layer according to an embodiment of the present invention.

Step d: as shown in FIG. 4, forming the pattern of the active layer on the substrate on which the first metal oxide semiconductor layer 4 and the second metal oxide semiconductor layer 5 is formed.

Specifically, a photoresist is coated to the second metal oxide semiconductor layer 5 and the photoresist is exposed. A photoresist reserved area and a photoresist unreserved area are formed. After the developing process, the photoresist unreserved area is completely removed, while the thickness of the photoresist reserved area remains unchanged. The first metal oxide semiconductor layer and the second metal oxide semiconductor layer in the photoresist unreserved area is completely etched through an etching process to form the pattern of the active layer. The remaining photoresist in the photoresist reserved area is peeling off.

Figure 5:
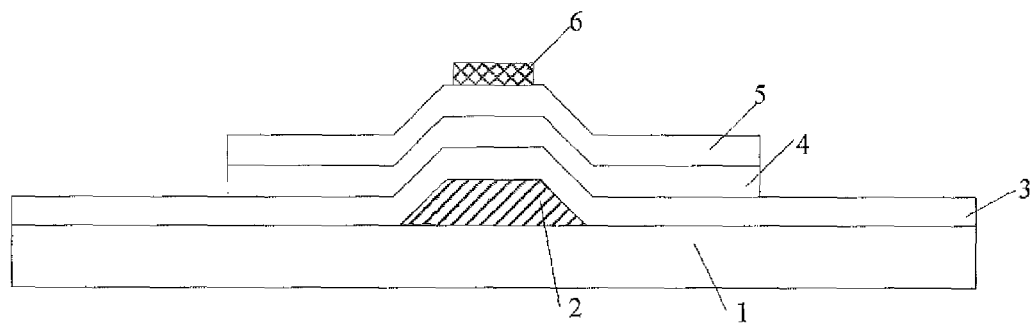
FIG. 5 is a sectional view showing a array substrate having the pattern of the etching barrier layer according to an embodiment of the present invention.

Step e: as shown in FIG. 5, forming the pattern of the etching barrier layer 6 on the substrate of the active layer 6.

Specifically, a material for the etching barrier layer is deposited on the substrate undergoing the Step d by the magnetron sputtering, the thermal evaporation or other film-forming methods, wherein the material for the etching barrier layer may be selected from the oxide or the nitride. A photoresist is coated to the material for the etching layer, and the photoresist is exposed with the presence of a mask. A photoresist reserved area and a photoresist unreserved area are formed. Wherein the photoresist reserved area corresponds to am area in which the pattern of the etching barrier layer 6 is located and the photoresist unreserved area corresponds to an area other than the area in which the pattern of the etching barrier layer 6 is located. After developing process, the photoresist unreserved area is completely removed, while the thickness of the photoresist reserved area remains unchanged. The material for the etching barrier layer in the photoresist unreserved area is completely etched by the etching process to form the pattern of the etching battier layer 6. The remaining photoresist is peeling off.

Figure 6:
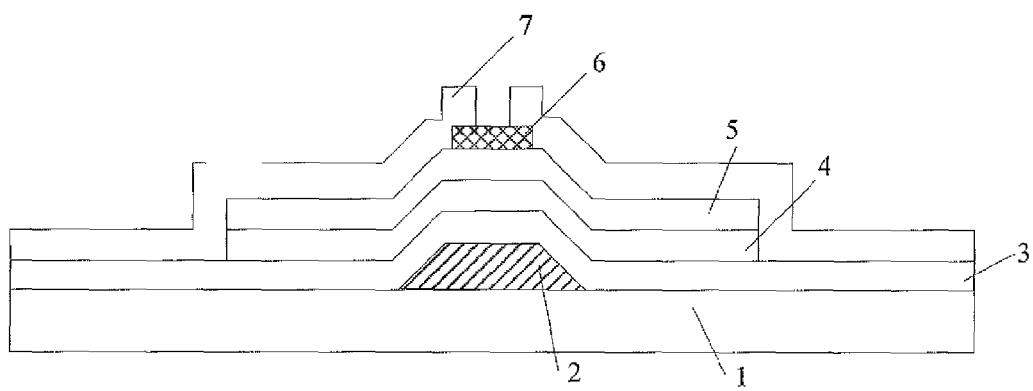
FIG. 6 is a sectional view showing a array substrate having the pattern of the source electrode, the drain electrode and the date line according to an embodiment of the present invention.

Step f, as shown in FIG. 6, forming the pattern of the source electrode, the drain electrode and the data line formed from a source-drain metal layer 7 on the substrate on which the etching barrier layer 6 is formed.

Specifically, the source-drain metal layer 7 is deposited on the substrate undergoing the Step e by the magnetron sputtering, the thermal evaporation or other film-forming methods. A material for the source-drain metal layer 7 may be Cr, W, Ti, Ta, Mo, Al, Cu, etc., or the alloy thereof. The source-drain metal layer 7 may also be consisted of multiple layers of the metal thin films. The photoresist is coated to the source-drain metal layer 7. The photoresist is exposed with the presence of the mask. A photoresist reserved area and a photoresist unreserved area are formed. Wherein the photoresist reserved area corresponds to an area in which the patterns of the source electrode, the drain electrode and the data line are located and the photoresist unreserved area corresponds to an area other than the area in which the patterns of the source electrode, the drain electrode and the data line are located. After developing process, the photoresist unreserved area is completely removed, while the thickness of the photoresist reserved area remains unchanged. The source-drain metal layer in the photoresist unreserved area is completely etched by the etching process to form the pattern of the source electrode, the drain electrode and the data line. The remaining photoresist is peeling off.

Figure 7:
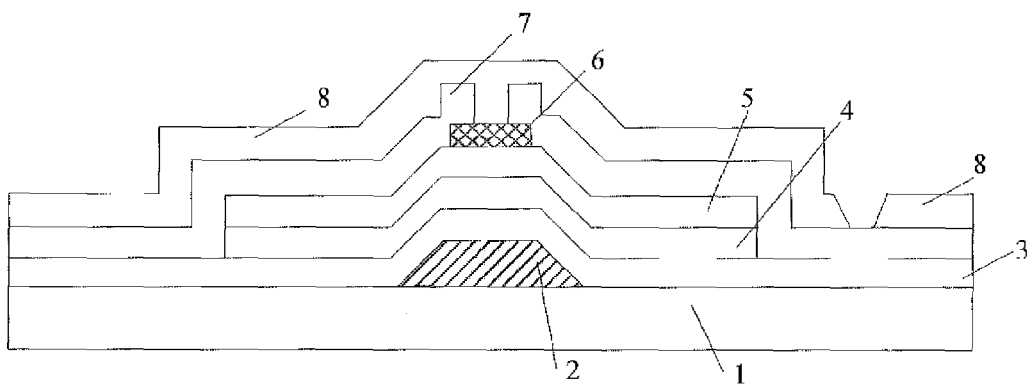
FIG. 7 is a sectional view showing a array substrate having the pattern of the passivation layer according to an embodiment of the present invention.

Step g: as shown in FIG. 7, forming the pattern of the passivation layer 8 on the substrate having the source electrode, the drain electrode and the data line.

Specifically, a material for the passivation layer is formed on the substrate undergoing the Step f in the thickness of 1000 Å~4500 Å by the magnetron sputtering, the thermal evaporation or other film-forming methods, wherein the material for the passivation layer may be selected from the oxide or the nitride. The passivation layer may be a composite layer of the oxide or the nitride. A photoresist is coated to the material for the passivation layer, and the photoresist is exposed with the presence of the mask. A photoresist reserved area and a photoresist unreserved area are formed. Wherein the photoresist reserved area corresponds to an area in which the pattern of the passivation layer is located and the photoresist unreserved area corresponds to an area other than the area in which the pattern of the passivation layer is located. After developing process, the photoresist unreserved area is completely removed, while the thickness of the photoresist reserved area remains unchanged. The material for the passivation layer in the photoresist unreserved area is completely etched by the etching process to form the pattern of the passivation layer 8. The remaining photoresist is peeling off.

Figure 8:
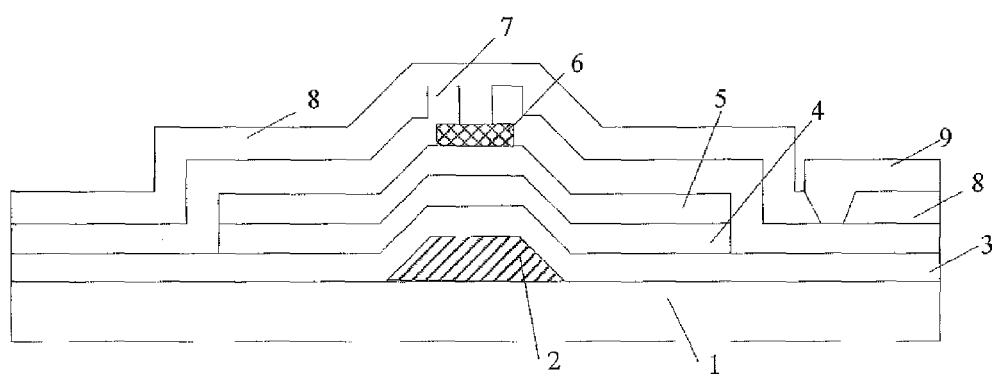
FIG. 8 is a sectional view showing a array substrate having the pixel electrode according to an embodiment of the present invention.

Step h: as shown in FIG. 8, forming the pattern of the pixel electrode 9 on the substrate having the passivation layer and connecting the pixel electrode 9 with the drain electrode through the via hole.

Specifically, a transparent electrical conductive layer having the thickness of 300 Å~600 Å is deposited on the substrate undergoing the step g by the magnetron sputtering, the thermal evaporation or other film-forming methods, wherein the transparent electrical conductive layer may use the material such as the indium tin oxide (ITO), the indium zinc oxide (IZO), etc. A photoresist is coated to the transparent electrical conductive layer, and the photoresist is exposed with the presence of the mask. A photoresist reserved area and a photoresist unreserved area are formed. Wherein the photoresist reserved area corresponds to an area in which the pattern of the pixel electrode 9 is located and the photoresist unreserved area corresponds to an area other than the area in which the pattern of the pixel electrode 9 is located. After developing process, the photoresist unreserved area is completely removed, while the thickness of the photoresist reserved area remains unchanged. The transparent electric conductive layer in the photoresist unreserved area is completely etched by the etching process to form the pattern of the pixel electrode 9. The remaining photoresist is peeling off.

The array substrate of this embodiment shown in FIG. 8 is obtained by adopting the above steps a-h. In the technical scheme of the embodiment of the present invention, the active layer of the array substrate comprises at least two metal oxide semiconductor layers, wherein the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer. This may have a function with reducing leakage current and stabilizing the performance of TFT. In this way, the active layer which has a good and stable performance and has high mobility can be manufactured by the combination of at least two metal oxide semiconductor layers.

All those described above are only preferred embodiments of the present invention. It should be pointed out that several improvements and modifications may also be made by a person having ordinary skill in this art, without departing the principle of the present invention. These improvements and modification should also be regarded as the protection scope of the present invention.

What is claimed is:

1. An array substrate, wherein an active layer of the array substrate comprises at least two metal oxide semiconductor layers, and wherein the at least two metal oxide semiconductor layers includes a first metal oxide semiconductor layer and a second metal oxide semiconductor layer on the first metal oxide semiconductor layer, the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer;
   wherein a drain electrode and a source electrode are formed from a source-drain metal layer on the etching barrier layer, and a passivation layer is formed on the drain electrode and the source electrode.

2. The array substrate according to claim 1, wherein the first metal oxide semiconductor layer has the mobility of greater than 30 $cm^2/V*s$, and the second metal oxide semiconductor layer has the mobility of greater than 8-10 $cm^2/V*s$.

3. The array substrate according to claim 2, wherein the first metal oxide semiconductor layer has a thickness of 10 nm-50 nm, and the second metal oxide semiconductor layer has a thickness of 10 nm-50 nm.

4. The array substrate according to claim 3, further comprising:
   a substrate,
   a gate electrode and a gate line on the substrate, wherein the gate insulating layer is formed on the gate electrode and the gate line,
   a data line, formed from the source-drain metal layer on the etching barrier layer, wherein the passivation layer is on the data line and comprises a via hole corresponding to the drain electrode, and
   a pixel electrode on the passivation layer, the pixel electrode electrically connecting with the drain electrode through the via hole.

5. The array substrate according to claim 2, wherein the first metal oxide semiconductor layer is ITZO, and the second metal oxide semiconductor layer is IGZO.

6. The array substrate according to claim 5, further comprising:
   a substrate,
   a gate electrode and a gate line on the substrate, wherein the gate insulating layer is formed on the gate electrode and the gate line,
   a data line, formed from the source-drain metal layer on the etching barrier layer, wherein the passivation layer is on the data line and comprises a via hole corresponding to the drain electrode, and
   a pixel electrode on the passivation layer, the pixel electrode electrically connecting with the drain electrode through the via hole.

7. The array substrate according to claim 2, further comprising:
   a substrate,
   a gate electrode and a gate line on the substrate, wherein the gate insulating layer is formed on the gate electrode and the gate line,
   a data line, formed from the source-drain metal layer on the etching barrier layer, wherein the passivation layer is on the data line and comprises a via hole corresponding to the drain electrode, and
   a pixel electrode on the passivation layer, the pixel electrode electrically connecting with the drain electrode through the via hole.

8. The array substrate according to claim 1, further comprising:
   a substrate,
   a gate electrode and a gate line on the substrate, wherein the gate insulating layer is formed on the gate electrode and the gate line,
   a data line, formed from the source-drain metal layer on the etching barrier layer, wherein the passivation layer is on the data line and comprises a via hole corresponding to the drain electrode, and
   a pixel electrode on the passivation layer, the pixel electrode electrically connecting with the drain electrode through the via hole.

9. A display device, comprising an array substrate, wherein an active layer of the array substrate comprises at least two metal oxide semiconductor layers, and wherein the at least two metal oxide semiconductor layers includes a first metal oxide semiconductor layer and a second metal oxide semiconductor layer on the first metal oxide semiconductor layer, the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer;
   wherein a drain electrode and a source electrode are formed from a source-drain metal layer on the etching barrier layer, and a passivation layer is formed on the drain electrode and the source electrode.

10. The display device according to claim 9, wherein the first metal oxide semiconductor layer has the mobility of greater than 30 $cm^2/V*s$, and the second metal oxide semiconductor layer has the mobility of greater than 8-10 $cm^2/V*s$.

11. The display device according to claim 10, wherein the first metal oxide semiconductor layer has a thickness of 10 nm-50 nm, and the second metal oxide semiconductor layer has a thickness of 10 nm-50 nm.

12. The display device according to claim 11, wherein the array substrate comprises:
   a substrate,
   a gate electrode and a gate line on the substrate, wherein the gate insulating layer is formed on the gate electrode and the gate line,
   a data line, formed from the source-drain metal layer on the etching barrier layer, wherein the passivation layer is on the data line and comprises a via hole corresponding to the drain electrode, and
   a pixel electrode on the passivation layer, the pixel electrode electrically connecting with the drain electrode through the via hole.

13. The display device according to claim 10, wherein the first metal oxide semiconductor layer is ITZO, and the second metal oxide semiconductor layer is IGZO.

14. The array substrate according to claim 13, wherein the array substrate comprises:
   a substrate,
   a gate electrode and a gate line on the substrate, wherein the gate insulating layer is formed on the gate electrode and the gate line,
   a data line, formed from the source-drain metal layer on the etching barrier layer, wherein the passivation layer is on the data line and comprises a via hole corresponding to the drain electrode, and
   a pixel electrode on the passivation layer, the pixel electrode electrically connecting with the drain electrode through the via hole.

15. The display device according to claim 10, wherein the array substrate comprises:
   a substrate,
   a gate electrode and a gate line on the substrate, wherein the gate insulating layer is formed on the gate electrode and the gate line,
   a data line, formed from the source-drain metal layer on the etching barrier layer, wherein the passivation layer is on the data line and comprises a via hole corresponding to the drain electrode, and
   a pixel electrode on the passivation layer, the pixel electrode electrically connecting with the drain electrode through the via hole.

16. The display device according to claim 9, wherein the array substrate comprises:
   a substrate,
   a gate electrode and a gate line on the substrate, wherein the gate insulating layer is formed on the gate electrode and the gate line,
   a data line, formed from the source-drain metal layer on the etching barrier layer, wherein the passivation layer is on the data line and comprises a via hole corresponding to the drain electrode, and
   a pixel electrode on the passivation layer, the pixel electrode electrically connecting with the drain electrode through the via hole.

17. A method for manufacturing an array substrate, comprising: forming an active layer of the array substrate comprising at least two metal oxide semiconductor layers,
   wherein the at least two metal oxide semiconductor layers includes a first metal oxide semiconductor layer and a second metal oxide semiconductor layer on the first metal oxide semiconductor layer, the first metal oxide semiconductor layer is formed on a gate insulating layer, an etching barrier layer is formed on the second metal oxide semiconductor layer, and the mobility of the first metal oxide semiconductor layer is greater than the mobility of the second metal oxide semiconductor layer;
   wherein the method comprises: forming a drain electrode and a source electrode on the etching barrier layer, and forming a passivation layer on the drain electrode and the source electrode.

18. The method for manufacturing the array substrate according to claim 17, wherein the method comprises:
   forming a pattern of a gate electrode and a gate line on a substrate, and forming the gate insulating layer,
   forming a pattern of the active layer on the substrate with the gate insulating layer,
   forming a pattern of the etching barrier layer on the substrate with the active layer,
   forming a data line on the substrate with the etching barrier layer, wherein the passivation layer is on the data line and comprises a via hole corresponding to the drain electrode, and
   forming a pattern of a pixel electrode on the substrate with the passivation layer, the pixel electrode electrically connecting with the drain electrode through the via hole.

19. The method for manufacturing the array substrate according to claim 18, a step of forming the pattern of the active layer on the substrate with the gate insulating layer comprises:
   depositing a first metal oxide semiconductor layer on the substrate with the gate insulating layer,
   depositing a second metal oxide semiconductor layer on the first metal oxide semiconductor layer,
   coating a photoresist to the second metal oxide semiconductor layer and forming a pattern of the active layer comprising the first metal oxide semiconductor layer and the second metal oxide semiconductor layer by a patterning process.

20. The method for manufacturing the array substrate according to the claim 17, wherein the first metal oxide semiconductor layer is ITZO, and the second metal oxide semiconductor layer is ITZO.

* * * * *